United States Patent
Huang et al.

(10) Patent No.: US 12,119,251 B2
(45) Date of Patent: *Oct. 15, 2024

(54) MULTIPLE SEMICONDUCTOR DIE CONTAINER LOAD PORT

(71) Applicant: Taiwan Semiconductor Manufacturing Company Limited, Hsinchu (TW)

(72) Inventors: Chih-Hung Huang, Hsinchu County (TW); Cheng-Lung Wu, Zhunan Township (TW); Yi-Fam Shiu, Toufen (TW); Yu-Chen Chen, Hemei Township (TW); Yang-Ann Chu, Hsinchu (TW); Jiun-Rong Pai, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 104 days.

This patent is subject to a terminal disclaimer.

(21) Appl. No.: 17/647,367

(22) Filed: Jan. 7, 2022

(65) Prior Publication Data
US 2022/0208570 A1 Jun. 30, 2022

Related U.S. Application Data

(63) Continuation of application No. 16/912,991, filed on Jun. 26, 2020, now Pat. No. 11,222,802.

(51) Int. Cl.
*H01L 21/677* (2006.01)
*B23Q 15/00* (2006.01)
(Continued)

(52) U.S. Cl.
CPC .......... *H01L 21/6773* (2013.01); *B23Q 15/00* (2013.01); *B23Q 16/00* (2013.01);
(Continued)

(58) Field of Classification Search
CPC .......... H01L 21/6773; H01L 21/67736; H01L 23/04; B23Q 15/00; B23Q 16/00
See application file for complete search history.

(56) References Cited

U.S. PATENT DOCUMENTS 9,184,078 B2 11/2015 Bonora et al.
11,222,802 B1 1/2022 Huang et al.
(Continued)

FOREIGN PATENT DOCUMENTS

| TW | 201314825 A | 4/2013 |
| TW | 202011191 A | 3/2020 |
| TW | 202013556 A | 4/2020 |

*Primary Examiner* — Gerald McClain
(74) *Attorney, Agent, or Firm* — Harrity & Harrity, LLP

(57) ABSTRACT

A multiple die container load port may include a housing with an opening, and an elevator to accommodate a plurality of different sized die containers. The multiple die container load port may include a stage supported by the housing and moveable within the opening of the housing by the elevator. The stage may include one or more positioning mechanisms to facilitate positioning of the plurality of different sized die containers on the stage, and may include different portions movable by the elevator to accommodate the plurality of different sized die containers. The multiple die container load port may include a position sensor to identify one of the plurality of different sized die containers positioned on the stage.

20 Claims, 15 Drawing Sheets

(51) Int. Cl.
*B23Q 16/00* (2006.01)
*G05D 5/04* (2006.01)
*H01L 23/04* (2006.01)

(52) U.S. Cl.
CPC ......... *G05D 5/04* (2013.01); *H01L 21/67736* (2013.01); *H01L 21/67778* (2013.01); *H01L 23/04* (2013.01)

(56) References Cited

U.S. PATENT DOCUMENTS

| | | |
|---|---|---|
| 11,282,725 B2 | 3/2022 | Ehrne et al. |
| 2005/0089388 A1 | 4/2005 | Park |
| 2017/0170037 A1* | 6/2017 | Gonzalez .......... H01L 21/67772 |
| 2019/0206709 A1* | 7/2019 | Li .................... H01L 21/67769 |

* cited by examiner

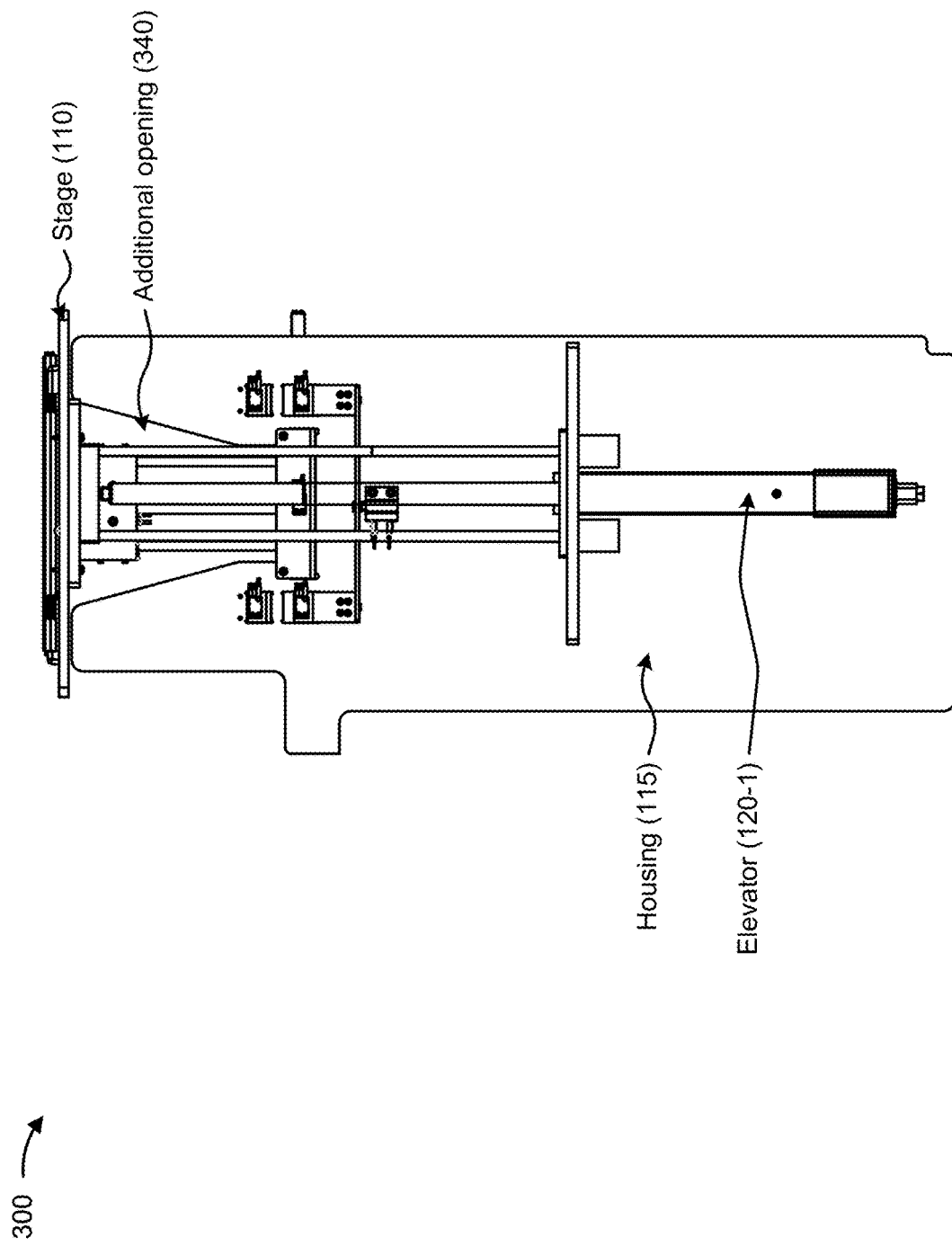

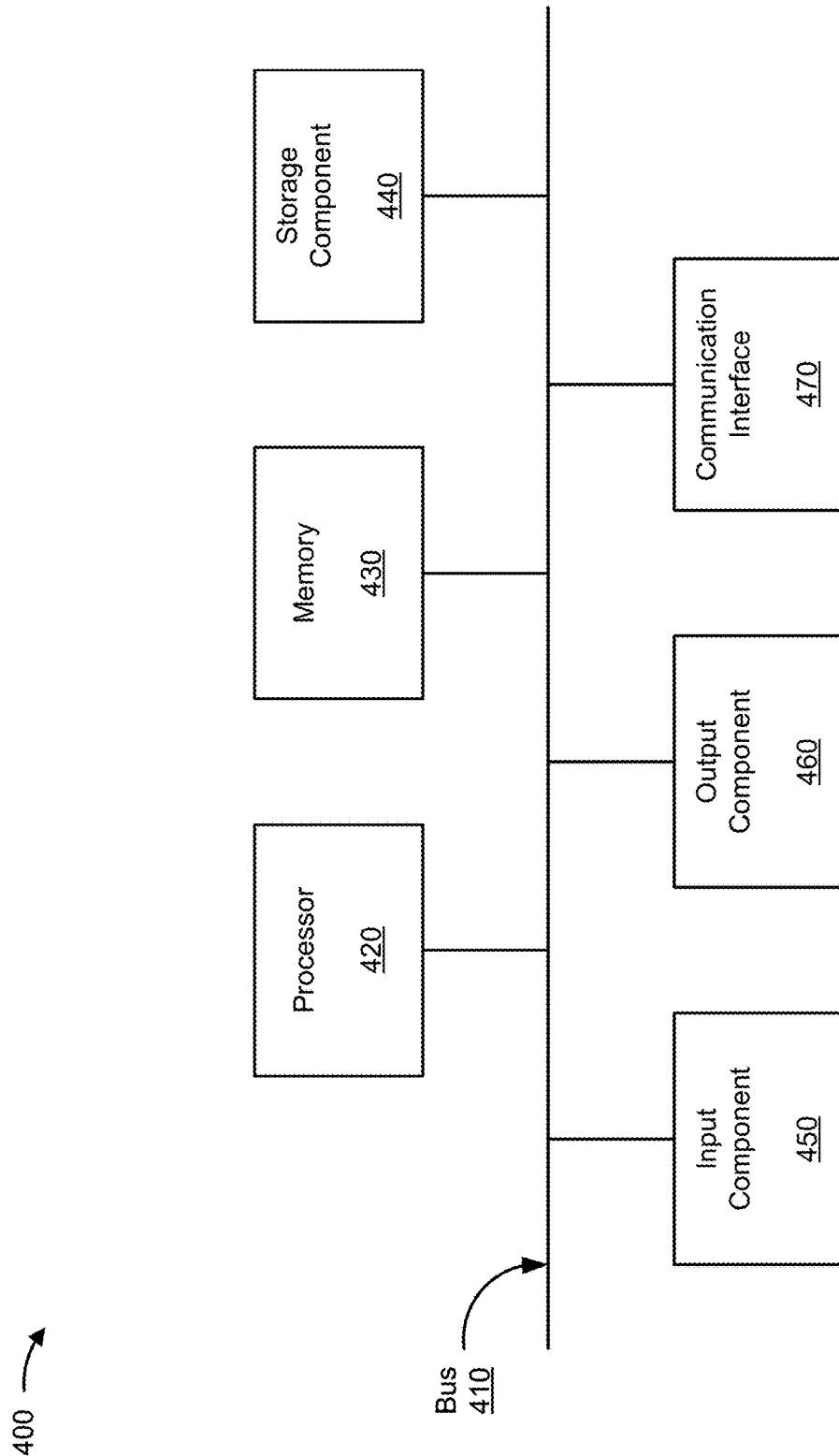

MULTIPLE SEMICONDUCTOR DIE CONTAINER LOAD PORT

RELATED APPLICATION

This application is a continuation of U.S. patent application Ser. No. 16/912,991, filed Jun. 26, 2020 (now U.S. Pat. No. 11,222,802), which is incorporated herein by reference in its entirety.

BACKGROUND

A die is a small block of semiconductor material on which a functional circuit is fabricated. Typically, integrated circuits are produced in large batches on a single wafer of a semiconductor material through processes such as photolithography. The semiconductor wafer is cut (e.g., diced) into pieces (e.g., dies), each containing a copy of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a diagram of example components of the multiple die container load port.

DETAILED DESCRIPTION

Figure 1A:
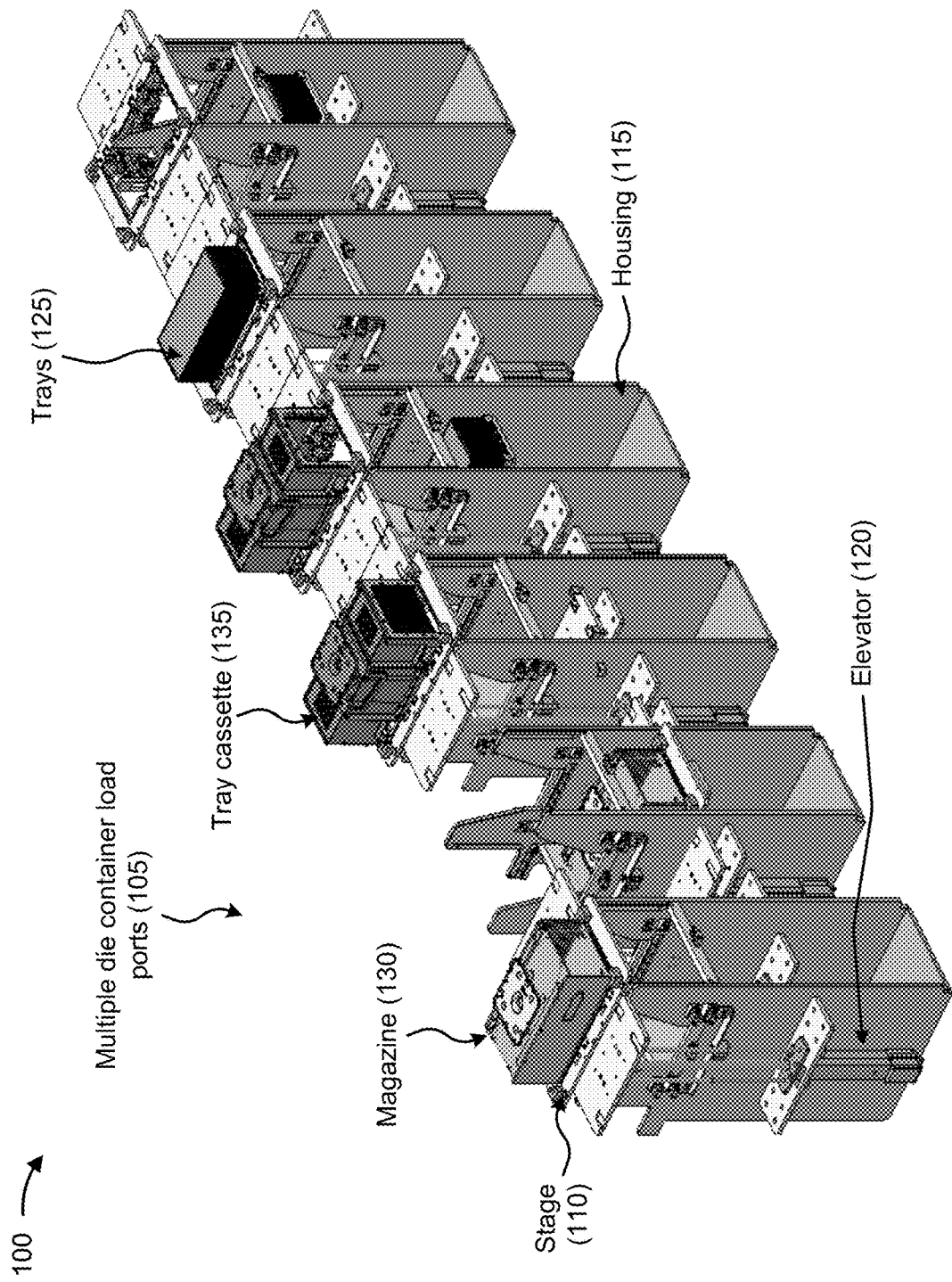
FIGS. 1A-3D are diagrams of an example implementation of a multiple die container load port described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a die processing tool, such as a die sorter, is used to test and divide dies from one semiconductor wafer into categories of varying qualities or other characteristics. Although all dies on a semiconductor wafer are intended to be identical, this may not always be the case. Sorting the dies according to characteristics of the dies becomes necessary in order to achieve a cost effective, high yield die attach or wire bond production operation. Currently, dies are provided to a die sorter tool via a load port that stores a die container with multiple dies. There are different types of die containers (e.g., with varying shapes and sizes), such as a tray, a magazine, a tray cassette, and/or the like. A tray may store a particular quantity of dies (e.g., two or more dies) depending on the sizes of the dies. A magazine and a tray cassette may store multiple trays, but the tray cassette may be larger in size than the magazine and may store more trays than the magazine. However, current load ports are designed to store a single type of die container and must be modified for the different types of die containers. Modifying current load ports for the different types of die containers wastes resources (e.g., human resources, tool resources, manufacturing resources, and/or the like) and creates an inflexible production requirement.

According to some implementations described herein, a multiple semiconductor die container load port may handle multiple different semiconductor die containers without modifying the load port for the different semiconductor die containers. For example, the multiple die container load port may include a housing with an opening, and an elevator to accommodate a plurality of different sized die containers. The multiple die container load port may include a stage supported by the housing and moveable within the opening of the housing by the elevator. The stage may include one or more positioning mechanisms to facilitate positioning of the plurality of different sized die containers on the stage, and may include different portions movable by the elevator to accommodate the plurality of different sized die containers. The multiple die container load port may include a position sensor to identify one of the plurality of different sized die containers positioned on the stage.

In this way, the multiple semiconductor die container load port may handle multiple different semiconductor die containers without modifying the load port for the different semiconductor die containers. For example, the multiple semiconductor die container load port may handle trays with dies, magazines with trays, tray cassettes with trays, and/or the like. Thus, the multiple semiconductor die container load port may prevent damage to dies caused by human handling of die containers, may increase throughput of die production functions, may conserve resources (e.g., human resources, tool resources, and/or manufacturing resources) that would have otherwise been used to modify a load port to support a different type of die container, and/or the like.

FIGS. 1A-1D are diagrams 100 of a multiple die container load port 105 described herein. As shown in FIG. 1A, multiple die container load port 105 may include a stage 110, a housing 115, and an elevator 120. Multiple die container load port 105 may handle different types of die containers, such as trays 125, a magazine 130, a tray cassette 135, and/or the like.

Stage 110 includes a mechanism to support different die containers, such as tray 125, magazine 130, tray cassette 135, and/or the like. For example, stage 110 may be sized and shaped to support the different die containers and may include a first portion to support trays 125 and a second portion to support magazine 130 and tray cassette 135, as described more fully below. Stage 110 may be constructed of a material or materials that are rigid enough to support weights of the different die containers. For example, stage 110 may be constructed of steel, aluminum, alloy, plastic, and/or the like. Further details of stage 110 are provided below in connection with one or more of FIGS. 1B-3D.

Housing 115 includes a structure that supports stage 110 and/or elevator 120. For example, housing 115 may be sized and shaped to enable stage 110 and/or portions of stage 110 to move to different heights within housing 115. Stage 110 may be moved by elevator 120 to different heights in order to align stage 110 with heights of conveyors associated with different die processing tools, such as a die sorter tool. Housing 115 may be constructed of a material or materials that are rigid enough to support weights of different die containers, stage 110, elevator 120, and/or the like. For example, housing 115 may be constructed of steel, aluminum, alloy, plastic, and/or the like. Further details of housing 115 are provided below in connection with one or more of FIGS. 1B-3D.

Elevator 120 includes a type of vertical transportation mechanism that moves stage 110 to different heights within housing 115. Elevator 120 may be connected to and supported by housing 115 or may be self-supporting. Elevator 120 may be powered by one or more electric motors that drive traction cables and counterweight systems such as a hoist. Elevator 120 may be sized and shaped to move stage 110 to different heights within housing 115. For example, elevator 120 may be sized and shaped to support and move weights of different die containers and stage 110. Elevator 120 may move stage 110 to different heights in order to align stage 110 with heights of conveyors associated with different die processing tools. Elevator 120 may be constructed of a material or materials that are rigid enough to support and move weights of different die containers and stage 110. For example, elevator 120 or components of elevator 120 may be constructed of steel, aluminum, alloy, plastic, and/or the like. In some implementations, elevator 120 includes or may be associated with a mechanism (e.g., a conveyor, a robot, and/or the like) that provides dies or die containers to conveyors associated with different die processing tools. Further details of elevator 120 are provided below in connection with one or more of FIGS. 1B-3D.

Tray 125 includes a support structure that carries multiple dies. For example, tray 125 may be sized and shaped to carry two or more dies, depending on the sizes of the dies and/or the size of tray 125. In some implementations, the support structure of tray 125 may include inserts that are sized and shaped to receive and retain dies. For example, the support structure of tray 125 may be rectangular to support rows of dies in the support structure. Tray 125 may be constructed of a material (e.g., plastic, steel, and/or the like) that is rigid enough to support dies but without damaging dies. Although tray 125 is shown in FIG. 1A as having a rectangular shape, in some implementations, tray 125 may have a different shape. Furthermore, although FIG. 1A depicts multiple trays 125 on stage 110, in some implementations, stage 110 may support a single tray 125.

Magazine 130 includes a structure that stores multiple trays 125. For example, magazine 130 may be sized and shaped to store two or more trays 125, depending on the sizes of trays 125 and/or the size of magazine 130. In some implementations, the structure of magazine 130 may include an opening that is sized and shaped to receive and retain trays 125. For example, the structure of magazine 130 may be box shaped with a front opening to receive trays 125 in magazine 130 and/or to remove trays 125 from magazine 130. Magazine 130 may be constructed of a material (e.g., plastic, steel, and/or the like) that is rigid enough to support trays 125. In some implementations, magazine 130 may occupy an area of stage 110 that is larger than an area of stage 110 that is occupied by tray 125. Although magazine 130 is shown in FIG. 1A as having a box shape (e.g., a rectangular box shape), in some implementations, magazine 130 may have a different shape.

Tray cassette 135 includes a structure that stores multiple trays 125 (e.g., more trays 125 than magazine 130). For example, tray cassette 135 may be sized and shaped to store two of more trays 125, depending on the sizes of trays 125 and/or the size of tray cassette 135. In some implementations, the structure of tray cassette 135 may include slots that are sized and shaped to receive and retain trays 125. For example, the structure of tray cassette 135 may be box shaped with a bottom opening to receive trays 125 in tray cassette 135 and/or to remove trays 125 from tray cassette 135. Tray cassette 135 may be constructed of a material (e.g., plastic, steel, and/or the like) that is rigid enough to support trays 125. In some implementations, tray cassette 135 may occupy an area of stage 110 that is larger than an area of stage 110 that is occupied by magazine 130. Although tray cassette 135 is shown in FIG. 1A as having a box shape (e.g., a rectangular box shape), in some implementations, tray cassette 135 may have a different shape.

Figure 1B:
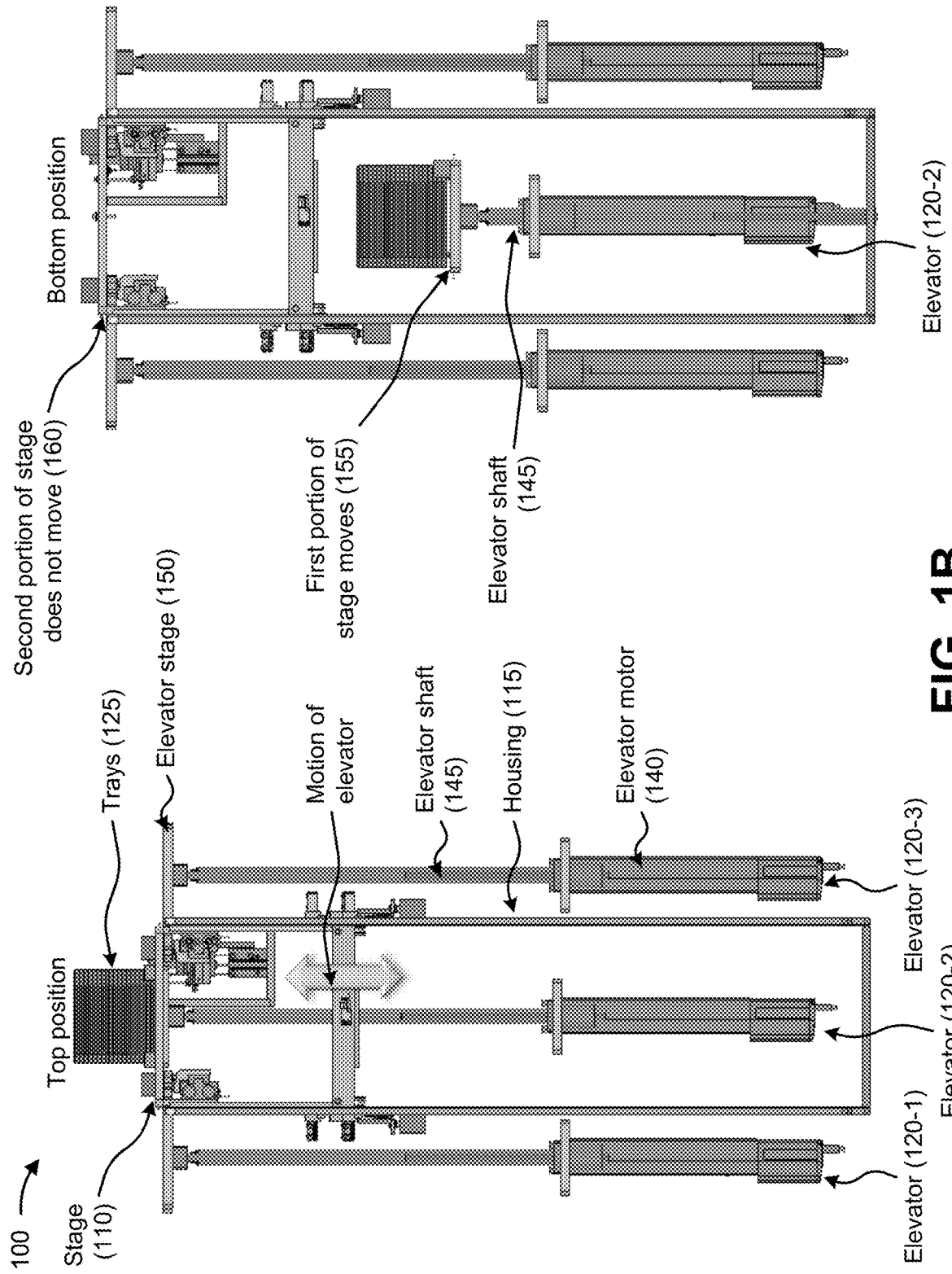

As shown to the left in FIG. 1B, multiple die container load port 105 may include multiple elevators 120, such as a first elevator 120-1, a second elevator 120-2, and a third elevator 120-3 (collectively referred to as elevators 120). Each of elevators 120 may include an elevator motor 140, an elevator shaft 145, and an elevator stage 150. Elevator motor 140 may include one or more electric motors that power elevator 120 and move elevator stage 150 in vertical directions (e.g., up toward stage 110 and down away from stage 110) via elevator shaft 145, as indicated by the motion of elevator arrow. Elevator shaft 145 may include a shaft constructed of a material (e.g., steel, aluminum, and/or the like) that is rigid enough to support weights of stage 110, elevator stage 150, and the different types of die containers. Elevator stage 150 may include a stage that is similar to stage 110, but that is sized and shaped to engage and/or support stage 110.

As further shown to the left in FIG. 1B, stage 110 may be provided at a top position (e.g., at a top of housing 115) for receiving trays 125. Thus, the top position may be referred to as a loading position of stage 110 since trays 125 are loaded on stage 110 at the top position. As shown to the right in FIG. 1B, and by reference number 155, the second elevator 120-2 (e.g., via elevator shaft 145 and elevator stage 150) may move a first portion of stage 110 and trays 125 downward and away from the loading position of stage 110 (e.g., at the top of housing 115) and within housing 115. In some implementations, the second elevator 120-2 may move the first portion of stage 110 and trays 125 to a height aligned with a conveyor of a die processing tool so that trays 125 may be provided to the conveyor. As further shown to the right in FIG. 1B, the first portion of stage 110 may be provided at a bottom position (e.g., at a bottom of housing 115) for unloading trays 125. Thus, the bottom position may be referred to as an unloading position of stage 110 since trays 125 are unloaded from stage 110 at the bottom position. As shown by reference number 160, a second portion of stage 110 may remain at the top position.

Figure 1C:
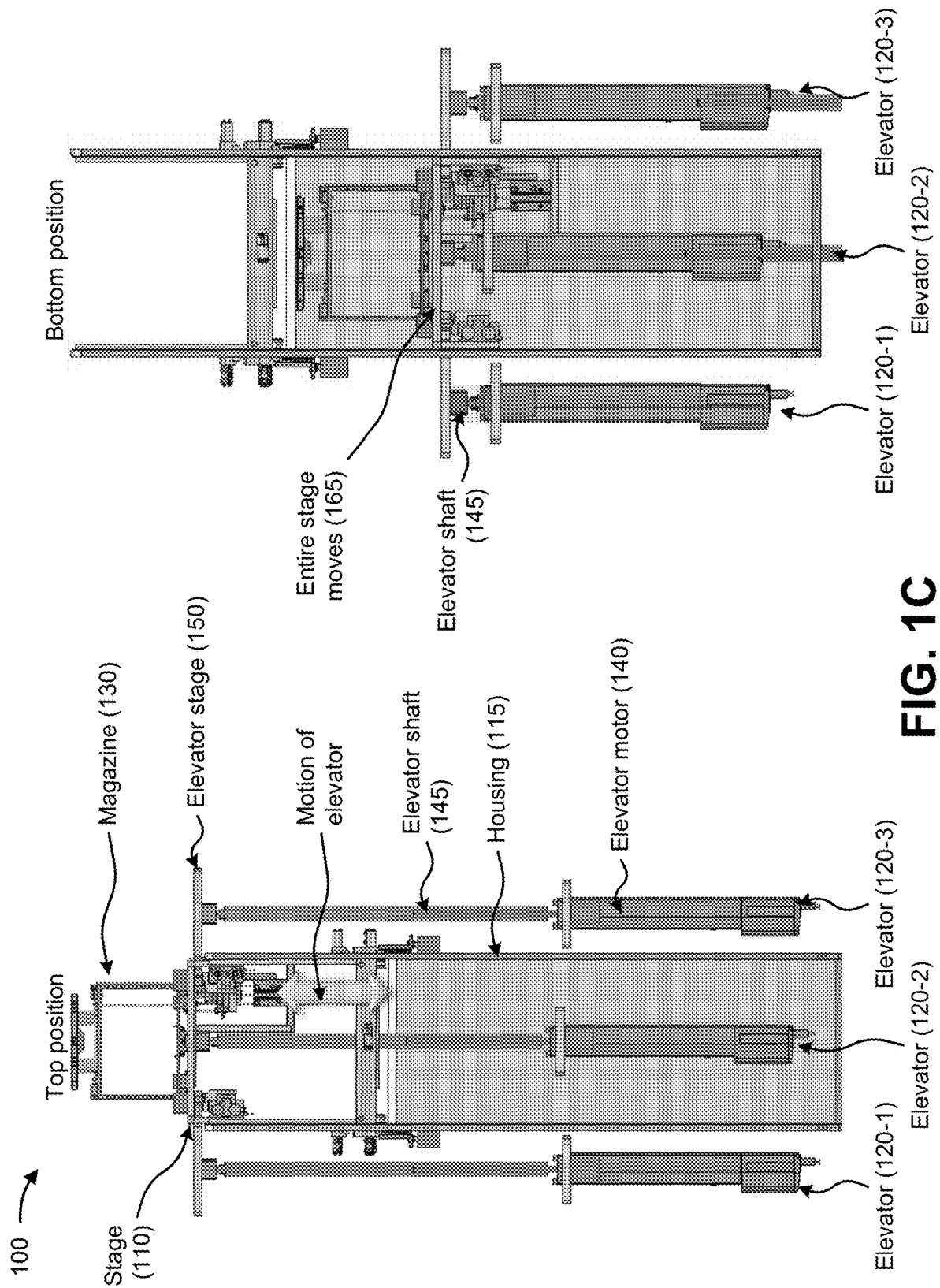

As shown to the left in FIG. 1C, stage 110 may be provided at a top position (e.g., at a top of housing 115) for receiving magazine 130. Thus, the top position may be referred to as a loading position of stage 110 since magazine 130 is loaded on stage 110 at the top position. As shown to the right in FIG. 1C, and by reference number 165, the first elevator 120-1, the second elevator 120-2, and the third elevator 120-3 (e.g., via elevator shafts 145 and elevator stages 150) may move the entire stage 110 (e.g., the first and second portions of stage 110) and magazine 130 downward and away from the loading position of stage 110 (e.g., at the top of housing 115) and within housing 115. In some implementations, the first elevator 120-1, the second elevator 120-2, and the third elevator 120-3 may move the first and second portions of stage 110 and magazine 130 to a height aligned with a conveyor of a die processing tool so that trays 125 of magazine 130 may be provided to the conveyor. As further shown to the right in FIG. 1C, the entire stage 110 may be provided at a bottom position (e.g., at a bottom of housing 115) for unloading trays 125 from magazine 130. Thus, the bottom position may be referred to as an unloading position of stage 110 since trays 125 of magazine 130 are unloaded from stage 110 at the bottom position.

Figure 1D:
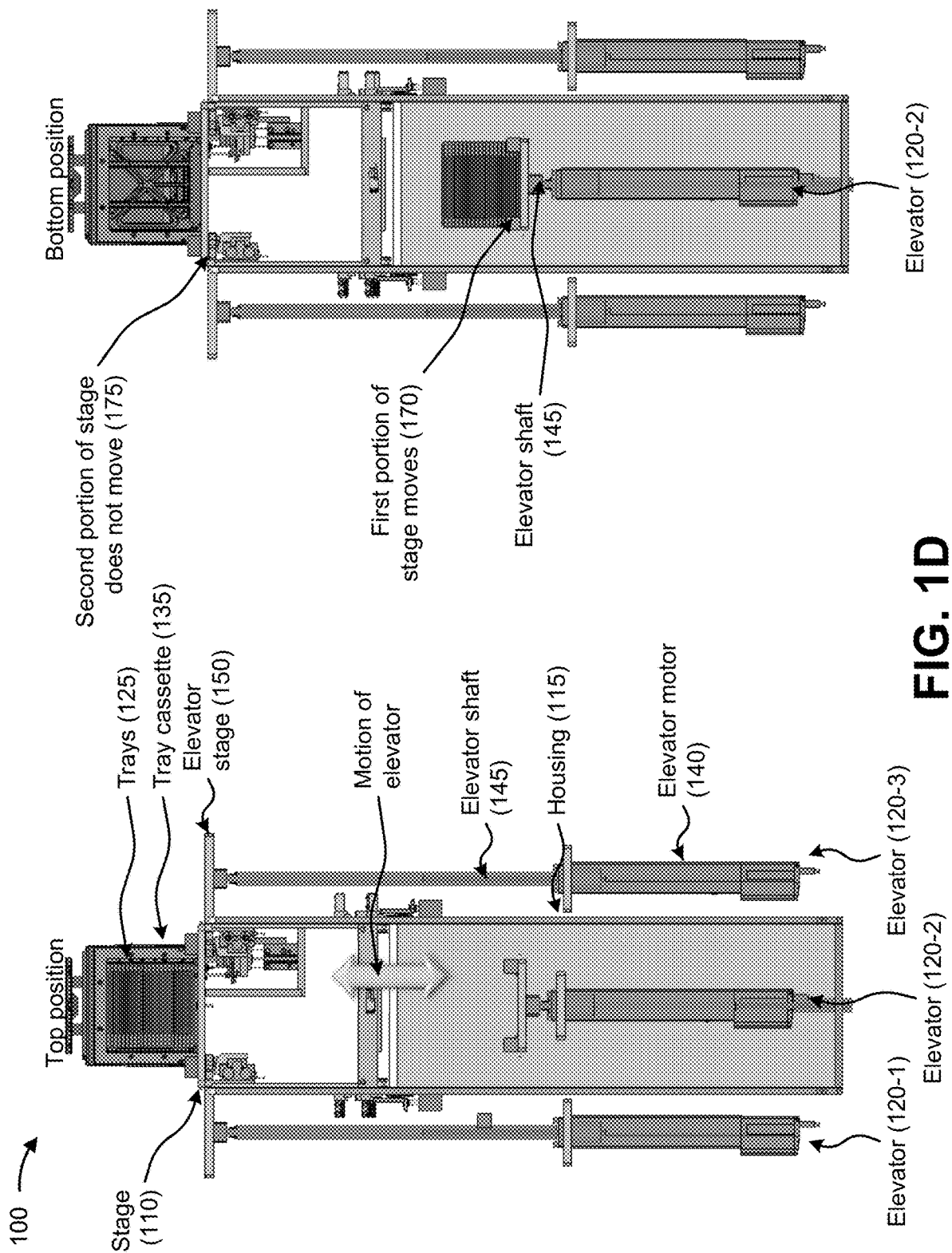

As shown to the left in FIG. 1D, stage 110 may be provided at a top position (e.g., at a top of housing 115) for receiving tray cassette 135 (e.g., with trays 125). Thus, the top position may be referred to as a loading position of stage 110 since tray cassette 135 is loaded on stage 110 at the top position. In order to remove trays 125 from tray cassette 135, the second elevator 120-2 may move elevator stage 150 upward to engage a bottom surface of the first portion of stage 110 (e.g., supporting trays 125). As shown to the right in FIG. 1D, and by reference number 170, the second elevator 120-2 (e.g., via elevator shaft 145 and elevator stage 150) may move the first portion of stage 110 and trays 125 of tray cassette 135 downward and away from the loading position of stage 110 (e.g., at the top of housing 115) and within housing 115. In some implementations, the second elevator 120-2 may move the first portion of stage 110 and trays 125 of tray cassette 135 to a height aligned with a conveyor of a die processing tool so that trays 125 may be provided to the conveyor. As further shown to the right in FIG. 1D, the first portion of stage 110 may be provided at a bottom position (e.g., at a bottom of housing 115) for unloading trays 125 of tray cassette 135. Thus, the bottom position may be referred to as an unloading position of stage 110 since trays 125 of tray cassette 135 are unloaded from stage 110 at the bottom position. As shown by reference number 175, the second portion of stage 110 may remain at the top position and may support tray cassette 135.

As indicated above, FIGS. 1A-1D are provided merely as one or more examples. Other examples may differ from what is described with regard to FIGS. 1A-1D.

Figure 2A:
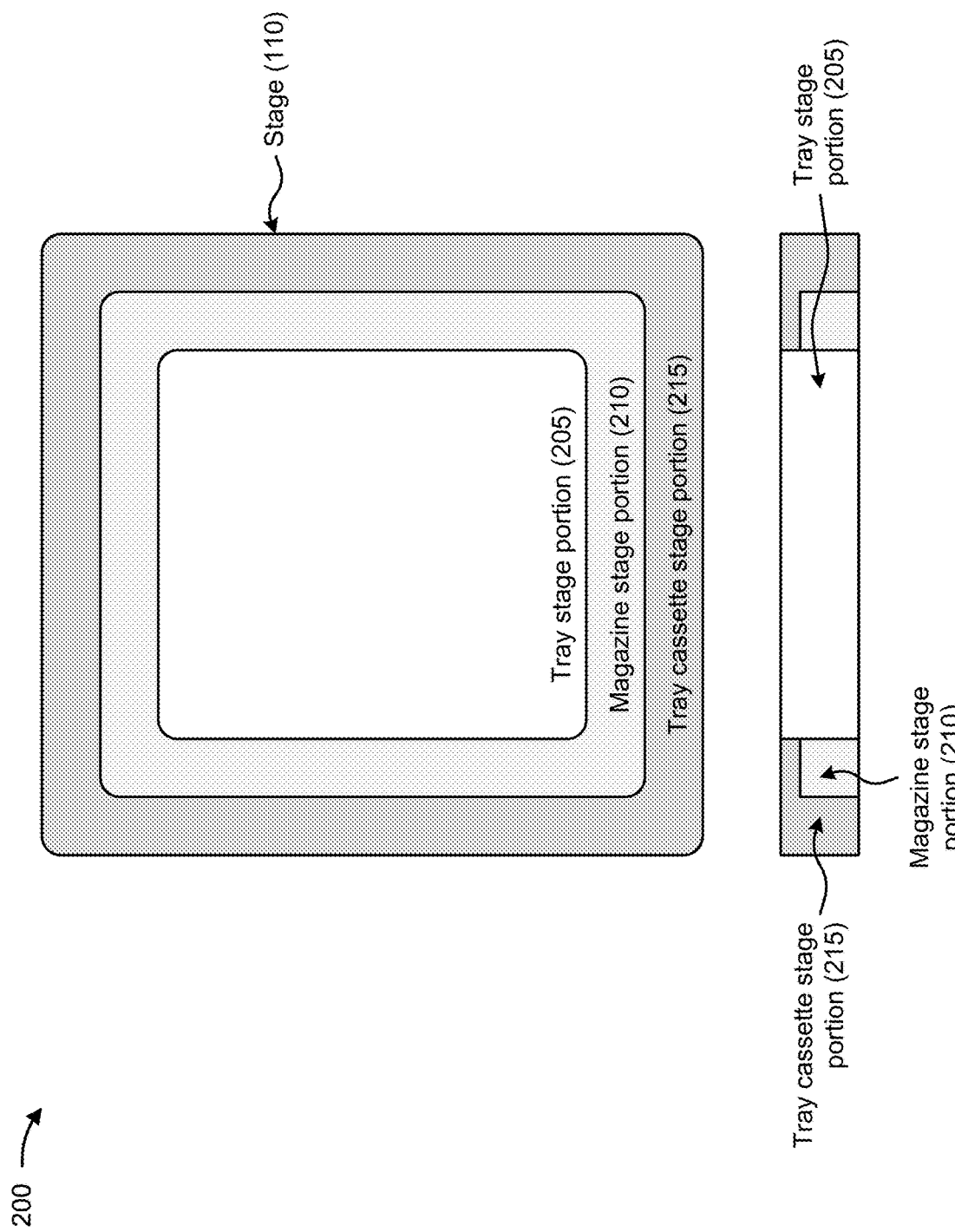

FIGS. 2A-2E are diagrams 200 of stage 110 of multiple die container load port 105 described herein. As shown in FIG. 2A, stage 110 may include a tray stage portion 205, a magazine stage portion 210, and a tray cassette stage portion 215. Tray stage portion 205 may include a portion of stage 110 that supports and retains trays 125. Magazine stage portion 210 may include a portion of stage 110 that supports and retains magazine 130. Tray cassette stage portion 215 may include a portion of stage 110 that supports and retains tray cassette 135. In some implementations, an area of tray cassette stage portion 215 may be greater than an area of magazine stage portion 210, and the area of magazine stage portion 210 may be greater than an area of tray stage portion 205. In some implementations, widths of tray stage portion 205 and tray cassette stage portion 215 may be equivalent or substantially equivalent, and widths of tray stage portion 205 and tray cassette stage portion 215 may be greater than a width of magazine stage portion 210.

Figure 2B:
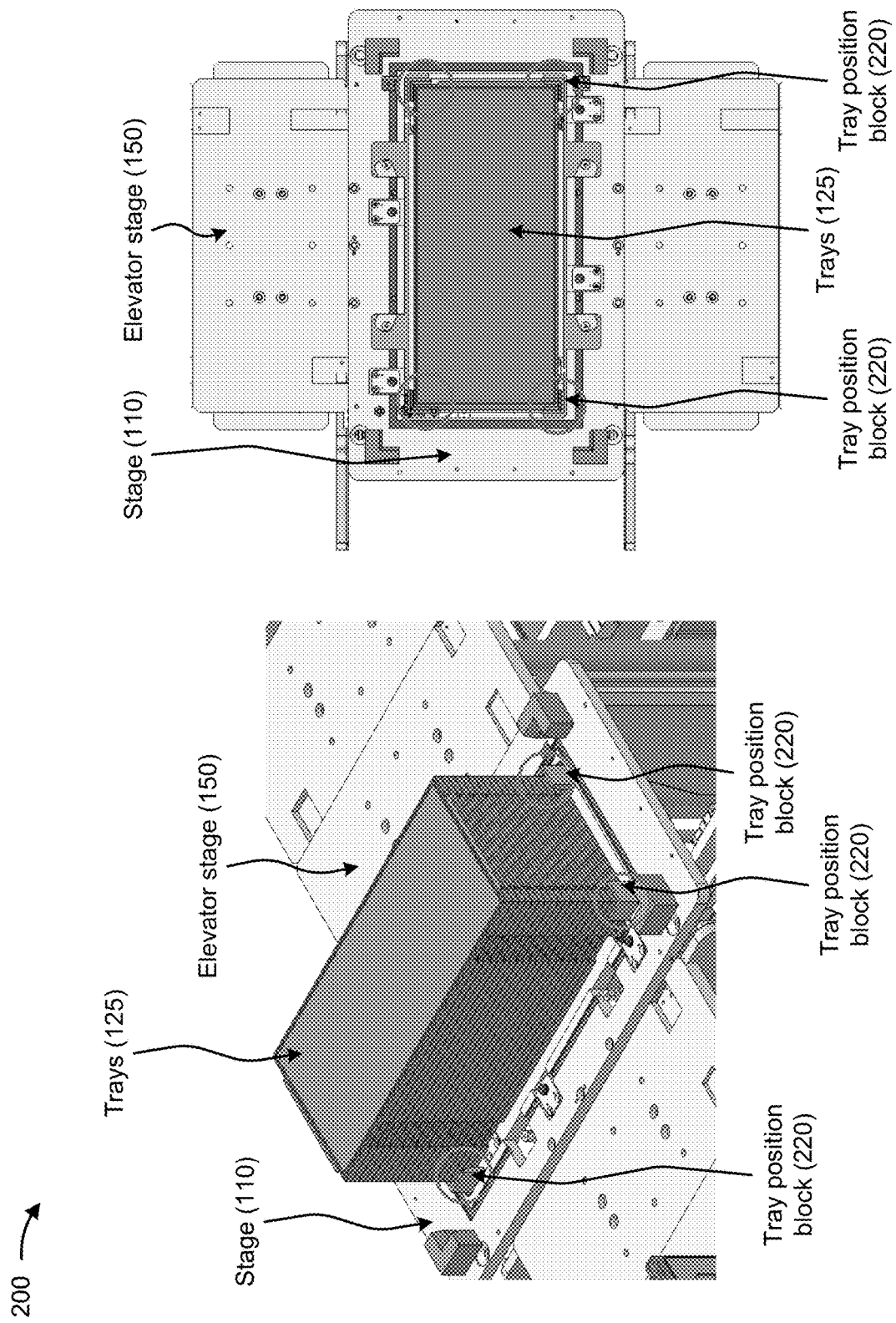

As shown in FIG. 2B, stage 110 (e.g., the first portion of stage 110) may include one or more tray position blocks 220 for positioning trays 125 on stage 110. Tray position blocks 220 may be sized and shaped to contact one or more corners of trays 125 when trays 125 are rectangular shaped, square shaped, and/or the like. Tray position blocks 220 may be constructed of a material (e.g., plastic, steel, rubber, and/or the like) that is rigid enough to position trays 125 on stage 110. As shown to the right in FIG. 2B, stage 110 may include four tray position blocks 220 that correspond to four corners of trays 125. Tray position blocks 220 may orient trays 125 on stage 110 so that trays 125 may align with a conveyor of a die processing tool and may be provided to the conveyor.

Figure 2C:
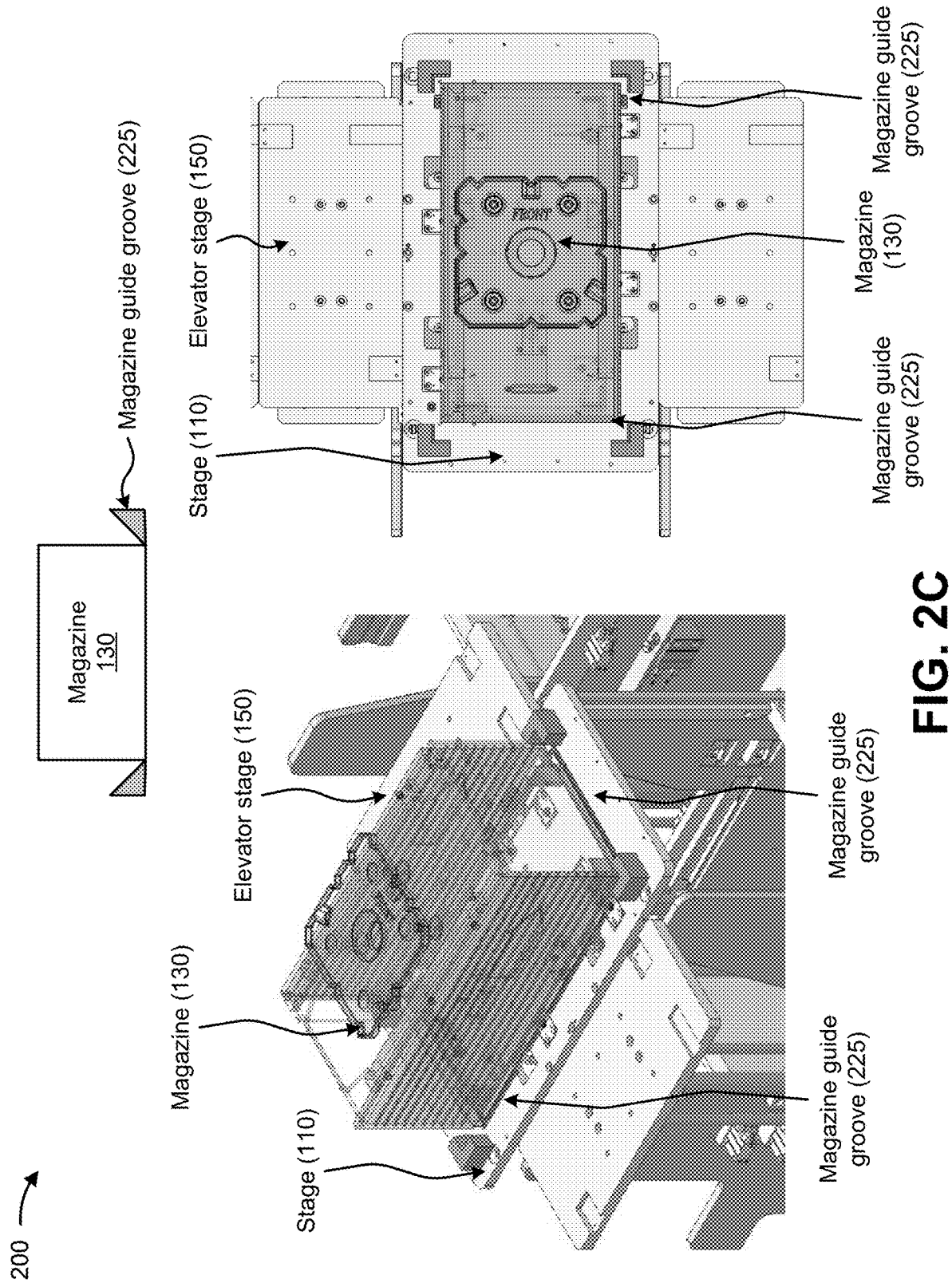

As shown in FIG. 2C, stage 110 may include a magazine guide groove 225 for positioning magazine 130 on stage 110. Magazine guide groove 225 may be sized and shaped to contact and retain bottom edges of magazine 130. For example, magazine guide groove 225 may include a same shape as a shape of the bottom edges of magazine 130, such as a rectangular shape, a square shape, and/or the like. Magazine guide groove 225 may be provided in the second portion of stage 110, and magazine 130 may fit within magazine guide groove 225, as shown at the top of FIG. 2C. Magazine guide groove 225 may be constructed of a material (e.g., plastic, steel, rubber, and/or the like) that is rigid enough to position magazine 130 on stage 110. As shown to the right in FIG. 2C, stage 110 may include a rectangular-shaped magazine guide groove 225 to corresponds to a rectangular-shaped magazine 130. Magazine guide groove 225 may orient magazine 130 on stage 110 so that trays 125 of magazine 130 may align with a conveyor of a die processing tool and may be provided to the conveyor.

Figure 2D:
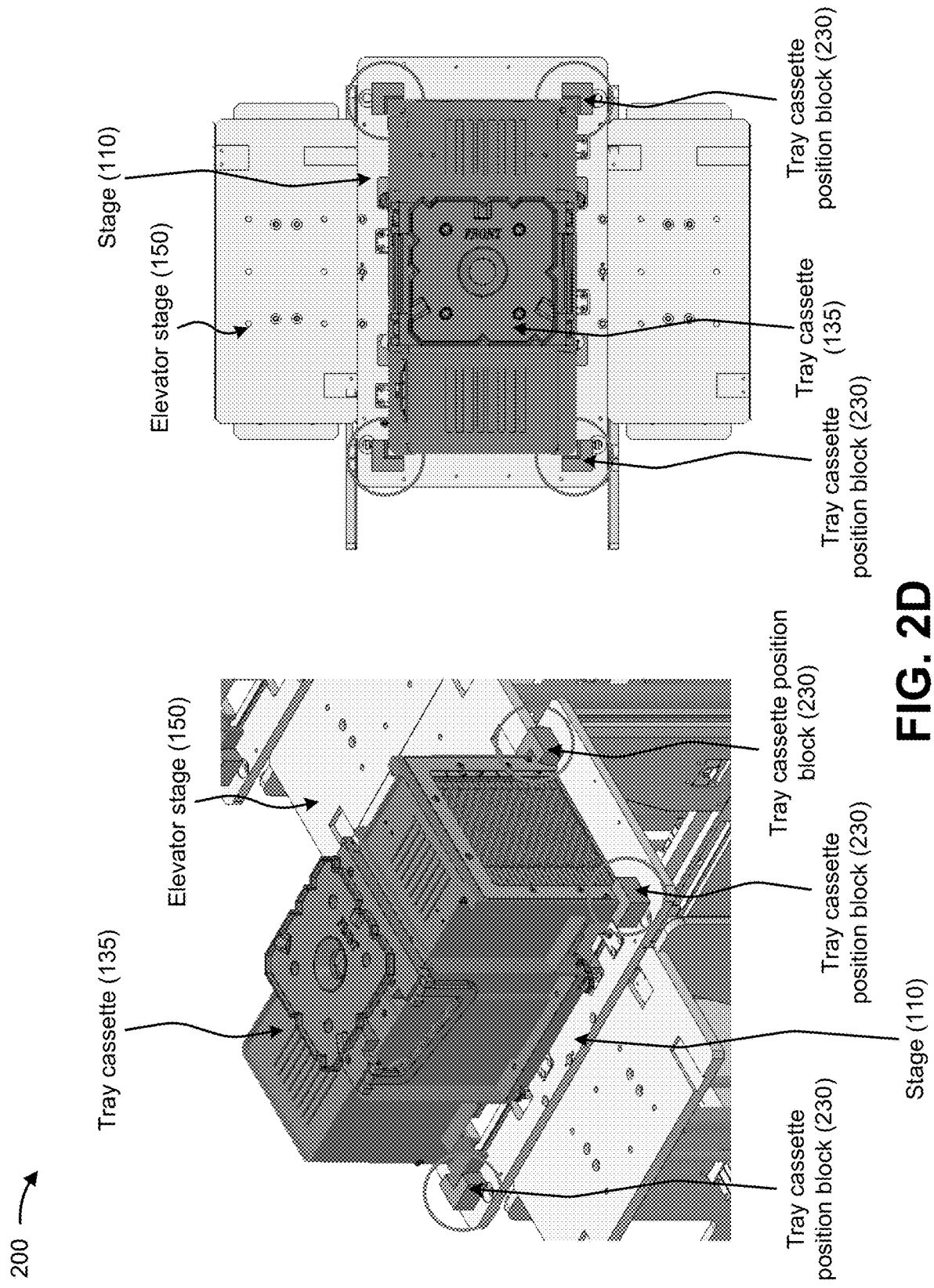

As shown in FIG. 2D, stage 110 (e.g., the second portion of stage 110) may include one or more tray cassette position blocks 230 for positioning tray cassette 135 on stage 110. Tray cassette position blocks 230 may be sized and shape to contact one or more corners of tray cassette 135 when tray cassette 135 is rectangular shaped, square shaped, and/or the like. Tray cassette position blocks 230 may be constructed of a material (e.g., plastic, steel, rubber, and/or the like) that is rigid enough to position tray cassette 135 on stage 110. As shown to the right in FIG. 2D, stage 110 may include four tray cassette position blocks 230 that correspond to four corners of tray cassette 135. Tray cassette position blocks 230 may orient tray cassette 135 on stage 110 so that trays 125 of tray cassette 135 may align with a conveyor of a die processing tool and may be provided to the conveyor.

Figure 2E:
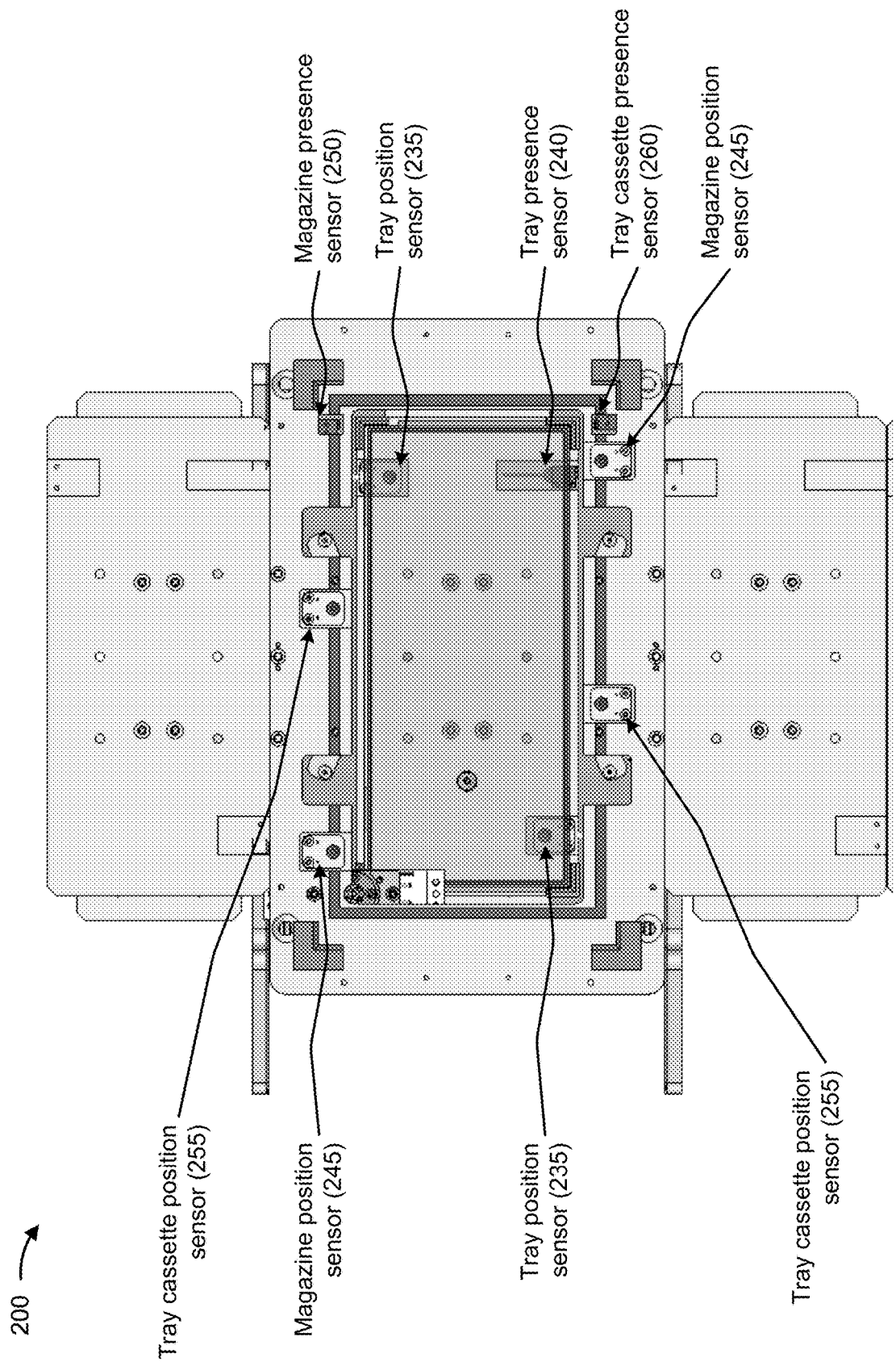

As shown in FIG. 2E, stage 110 may include one or more tray position sensors 235 and one or more tray presence sensors 240. Tray position sensor 235 may include an optical sensor, a pressure sensor, and/or the like that identifies and detects a position of trays 125 on stage 110 (e.g., on the first portion of stage 110). In some implementations, detecting the position of trays 125 may cause tray position sensor 235 to generate a signal indicating to multiple die container load port 105 (e.g., a processor of multiple die container load port 105) that trays 125 are correctly positioned on stage 110. If trays 125 are incorrectly positioned on stage 110, tray position sensor 235 may provide, to multiple die container load port 105, a signal indicating that trays 125 are incorrectly positioned on stage 110. In this way, multiple die container load port 105 may provide (e.g., to an operator of multiple die container load port 105) a notification indicating that trays 125 are incorrectly positioned on stage 110 (e.g., so that a robotic arm or the operator may correct the position of trays 125 on stage 110).

Tray presence sensor 240 may include an optical sensor, a pressure sensor, and/or the like that identifies and detects a presence of trays 125 on stage 110 (e.g., on the first portion of stage 110). In some implementations, detecting the presence of trays 125 may cause tray presence sensor 240 to generate a signal indicating to multiple die container load port 105 (e.g., a processor of multiple die container load port 105) that trays 125 are provided on stage 110. In this way, multiple die container load port 105 may determine that trays 125 are available to be manipulated by multiple die container load port 105. A signal from tray position sensor 235, a signal from tray presence sensor 240, or a combination thereof may be used to enable elevator 120. For example, when the signal from tray position sensor 235 indicates a correctly positioned tray 125 and/or when the signal from tray presence sensor 240 indicates the presence of tray 125, elevator 120 may be enabled for use, may be disabled unless enabled, and/or the like.

As further shown in FIG. 2E, stage 110 may include one or more magazine position sensors 245 and one or more magazine presence sensors 250. Magazine position sensor 245 may include an optical sensor, a pressure sensor, and/or the like that identifies and detects a position of magazine 130 on stage 110 (e.g., on the second portion of stage 110). In some implementations, detecting the position of magazine 130 may cause magazine position sensor 245 to generate a signal indicating to multiple die container load port 105 (e.g., a processor of multiple die container load port 105) that magazine 130 is correctly positioned on stage 110. If magazine 130 is incorrectly positioned on stage 110, magazine position sensor 245 may provide, to multiple die container load port 105, a signal indicated that magazine 130 is incorrectly positioned on stage 110. In this way, multiple die container load port 105 may provide (e.g., to an operator of multiple die container load port 105) a notification indicating that magazine 130 is incorrectly positioned on stage 110 (e.g., so that a robotic arm or the operator may correct the position of magazine 130 on stage 110).

Magazine presence sensor 250 may include an optical sensor, a pressure sensor, and/or the like that identifies and detects a presence of magazine 130 on stage 110 (e.g., on the second portion of stage 110). In some implementations, detecting the presence of magazine 130 may cause magazine presence sensor 250 to generate a signal indicating to multiple die container load port 105 (e.g., a processor of multiple die container load port 105) that magazine 130 is provided on stage 110. In this way, multiple die container load port 105 may determine that magazine 130 is available to be manipulated by multiple die container load port 105. A signal from magazine position sensor 245, a signal from magazine presence sensor 250, or a combination thereof may be used to enable elevator 120. For example, when the signal from magazine position sensor 245 indicates a correctly positioned magazine 130 and/or when the signal from magazine presence sensor 250 indicates the presence of magazine 130, elevator 120 may be enabled for use, may be disabled unless enabled, and/or the like.

As further shown in FIG. 2E, stage 110 may include one or more tray cassette position sensors 255 and one or more tray cassette presence sensors 260. Tray cassette position sensor 255 may include an optical sensor, a pressure sensor, and/or the like that identifies and detects a position of tray cassette 135 on stage 110 (e.g., on the second portion of stage 110). In some implementations, detecting the position of tray cassette 135 may cause tray cassette position sensor 255 to generate a signal indicating to multiple die container load port 105 (e.g., a processor of multiple die container load port 105) that tray cassette 135 is correctly positioned on stage 110. If tray cassette 135 is incorrectly positioned on stage 110, tray cassette position sensor 255 may provide, to multiple die container load port 105, a signal indicated that tray cassette 135 is incorrectly positioned on stage 110. In this way, multiple die container load port 105 may provide (e.g., to an operator of multiple die container load port 105) a notification indicating that tray cassette 135 is incorrectly positioned on stage 110 (e.g., so that a robotic arm or the operator may correct the position of tray cassette 135 on stage 110).

Tray cassette presence sensor 260 may include an optical sensor, a pressure sensor, and/or the like that identifies and detects a presence of tray cassette 135 on stage 110 (e.g., on the second portion of stage 110). In some implementations, detecting the presence of tray cassette 135 may cause tray cassette presence sensor 260 to generate a signal indicating to multiple die container load port 105 (e.g., a processor of multiple die container load port 105) that tray cassette 135 is provided on stage 110. In this way, multiple die container load port 105 may determine that tray cassette 135 is available to be manipulated by multiple die container load port 105. A signal from tray cassette position sensor 255, a signal from tray cassette presence sensor 260, or a combination thereof may be used to enable elevator 120. For example, when the signal from tray cassette position sensor 255 indicates a correctly positioned tray cassette 135 and/or when the signal from tray cassette presence sensor 260 indicates the presence of tray cassette 135, elevator 120 may be enabled for use, may be disabled unless enabled, and/or the like.

As indicated above, FIGS. 2A-2E are provided merely as one or more examples. Other examples may differ from what is described with regard to FIGS. 2A-2E.

Figure 3A:
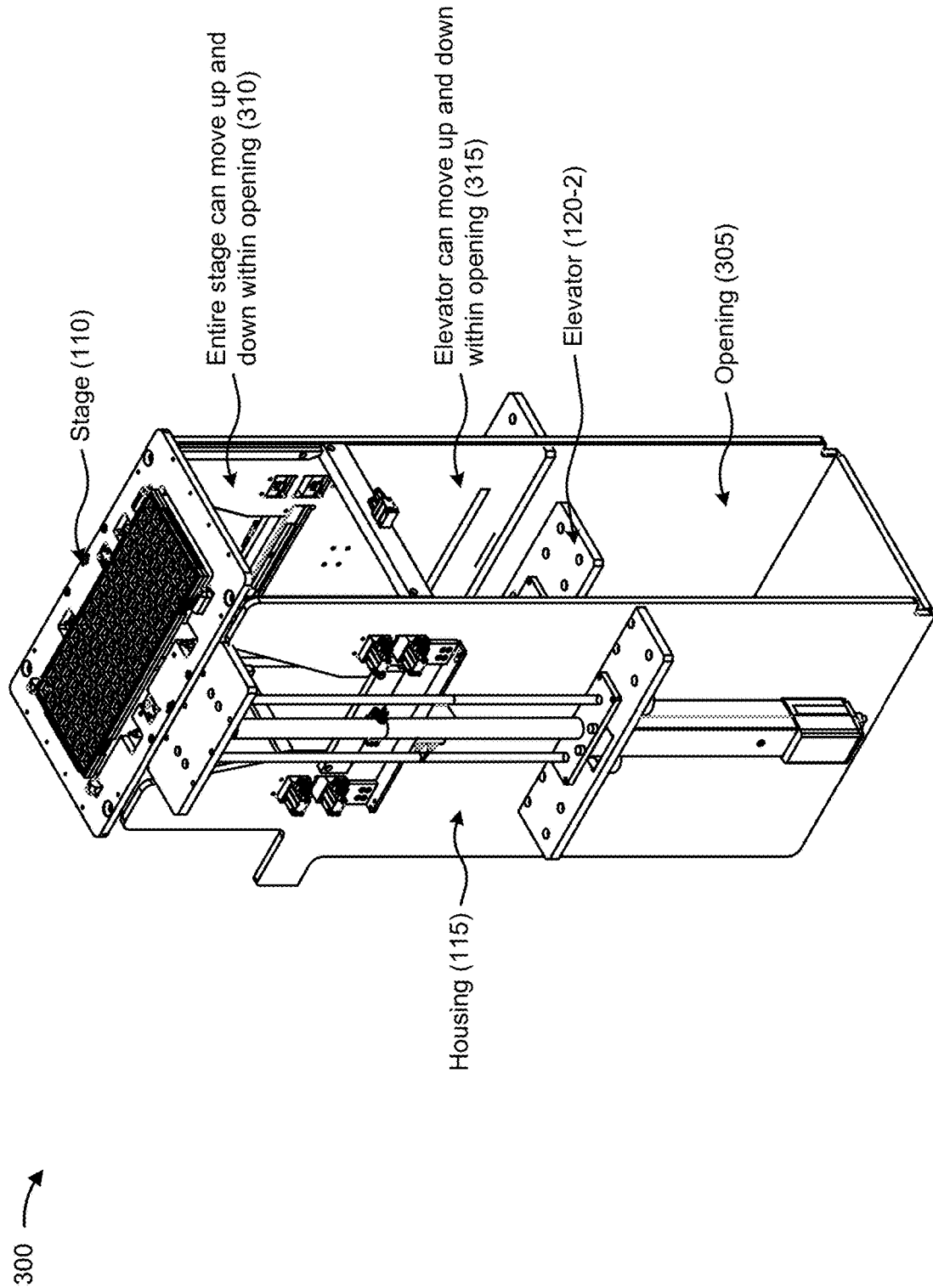

FIGS. 3A-3D are diagrams 300 of multiple die container load port 105 described herein. FIG. 3A provides a perspective view of multiple die container load port 105. As shown, housing 115 may include an opening 305 that houses the second elevator 120-2 and that enables multiple die container load port 105 to provide trays 125 to one or more conveyors of a die processing tool. As further shown in FIG. 3A, and by reference number 310, the entire stage 110 may move up and down within opening 305 (e.g., via elevators 120). In some implementations, the second elevator 120-2 may move the first portion 240 of stage up and down within operating 305 when the die container is trays 125 or tray cassette 135. In some implementations, elevators 120 may move the first and second portions of stage 110 up and down within opening 305 when the die container is magazine 130. As further shown in FIG. 3A, and by reference number 315, the second elevator 120-2 may move up and down within opening 305 to move the first portion of stage 110 up and down.

Figure 3B:
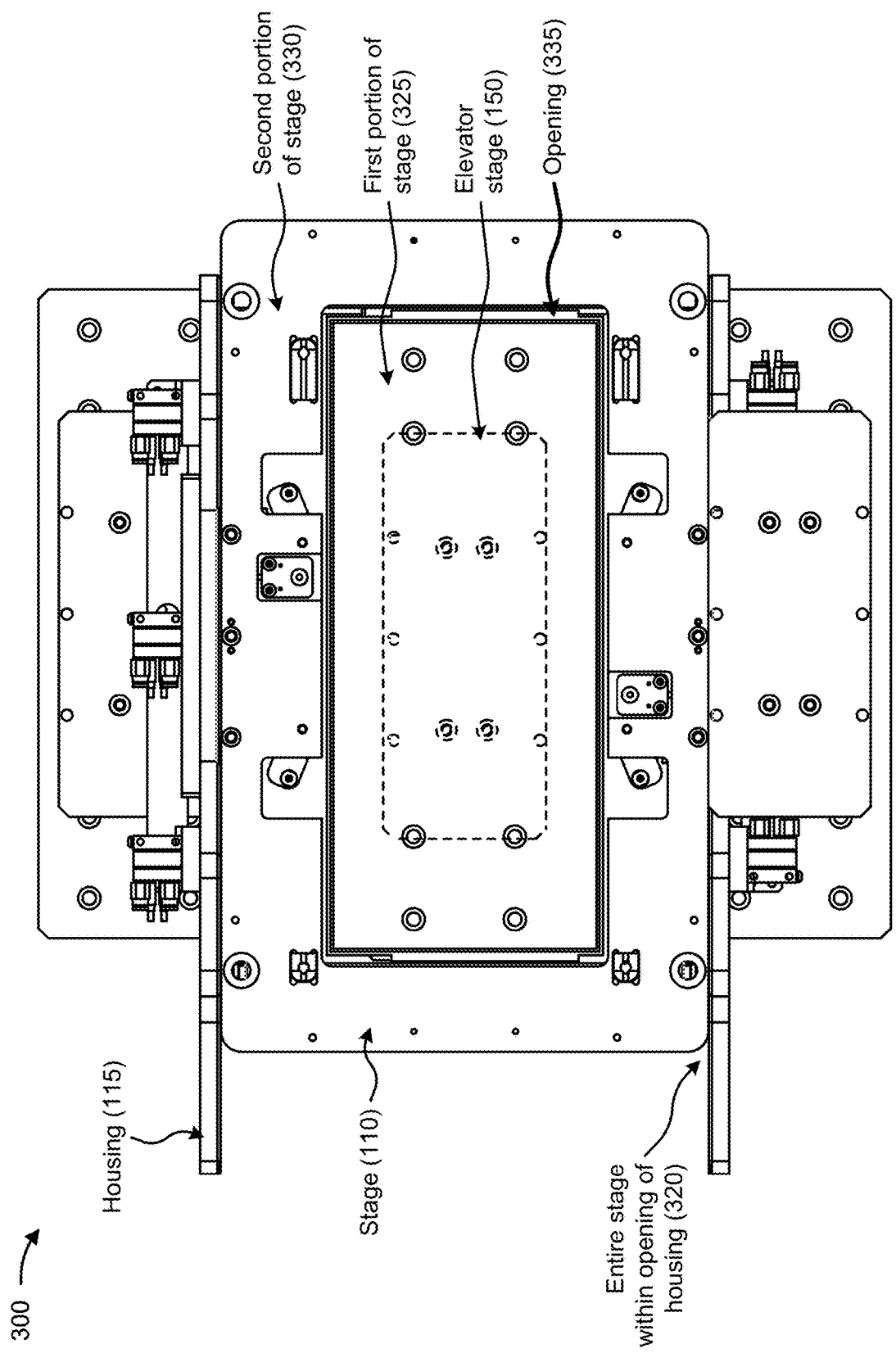

FIG. 3B provides a top view of multiple die container load port 105, and shows stage 110 and housing 115. Stage 110 and housing 115 may include the features described elsewhere herein. As further shown in FIG. 3B, and by reference number 320, stage 110 and housing 115 may be sized and shaped so that the entire stage 110 may fit within opening 305 of housing 115. As further shown in FIG. 3B, stage 110 may include two portions, an inner first portion 325 and an outer second portion 330. Second portion 330 may be larger in size than first portion 325 and an opening 335 may separate first portion 325 from second portion 330. In some implementations, first portion 325 of stage 110 may be utilized to support and transport trays 125 and/or one or more trays 125 from tray cassette 135 to a conveyor (e.g., via the second elevator 120-2). In some implementations, second portion 330 of stage 110 may be utilized to support and transport magazine 130 to a conveyor (e.g., via elevators 120) and/or to support tray cassette 135.

FIG. 3C provides a side view of multiple die container load port 105, and shows stage 110, housing 115, and the first elevator 120-1. Stage 110, housing 115, and the first elevator 120-1 may include the features described elsewhere herein. As further shown in FIG. 3C, an additional opening 340 may be provided on sides of housing 115 near the loading position of stage 110. Additional opening 340 may ensure that components, attached to stage 110 and extending outside of housing 115, do not contact housing 115 when stage 110 is moved down into housing 115.

Figure 3D:
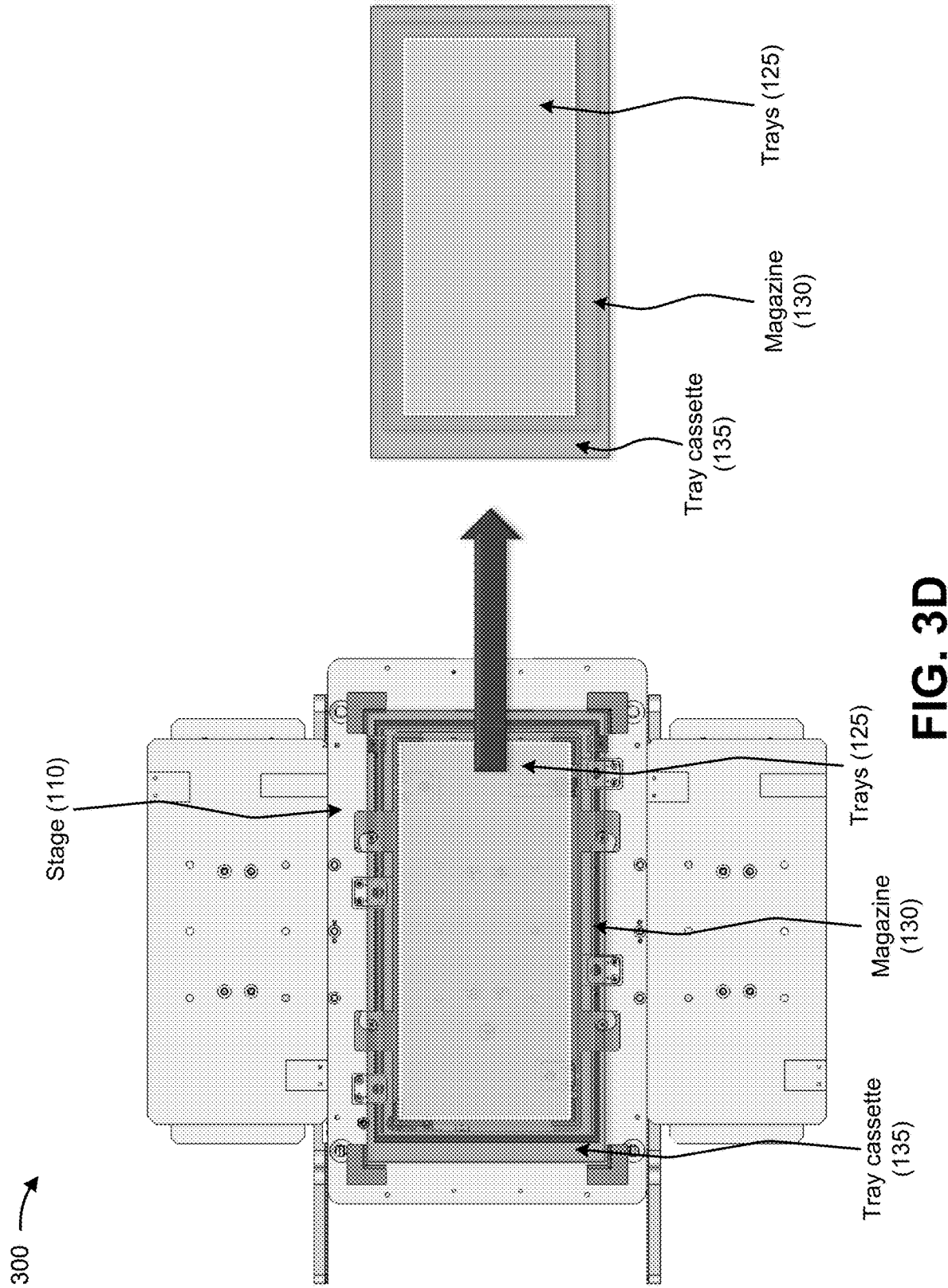

FIG. 3D provides a top view of multiple die container load port 105, and shows stage 110, trays 125, magazine 130, and tray cassette 135. Stage 110, trays 125, magazine 130, and tray cassette 135 may include the features described elsewhere herein. As further shown in FIG. 3D, trays 125 may be supported by a first area of the stage 110, magazine 130 may be supported by a second area of the stage, and tray cassette 135 may be supported by a third area of the stage. The third area (e.g., the area encompassed by tray cassette 135) may be greater than the second area (e.g., the area encompassed by magazine 130), and the second area may be greater than the first area (e.g., the area encompassed by trays 125).

As indicated above, FIGS. 3A-3D are provided merely as one or more examples. Other examples may differ from what is described with regard to FIGS. 3A-3D.

FIG. 4 is a diagram of example components of a device 400. Device 400 may correspond to multiple die container load port 105. In some implementations, the multiple die container load port 105 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among the components of device 400. Processor 420 is implemented in hardware, firmware, or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random-access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a sensor for sensing information (e.g., a global positioning system (GPS) component, an accelerometer, a gyroscope, and/or an actuator). Output component 460 includes a component that provides output information from device 400 (e.g., a display, a speaker, and/or one or more LEDs).

Communication interface 470 includes a transceiver-like component (e.g., a transceiver and/or a separate receiver and transmitter) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, an RF interface, a universal serial bus (USB) interface, a wireless local area interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. A computer-readable medium is defined herein as a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
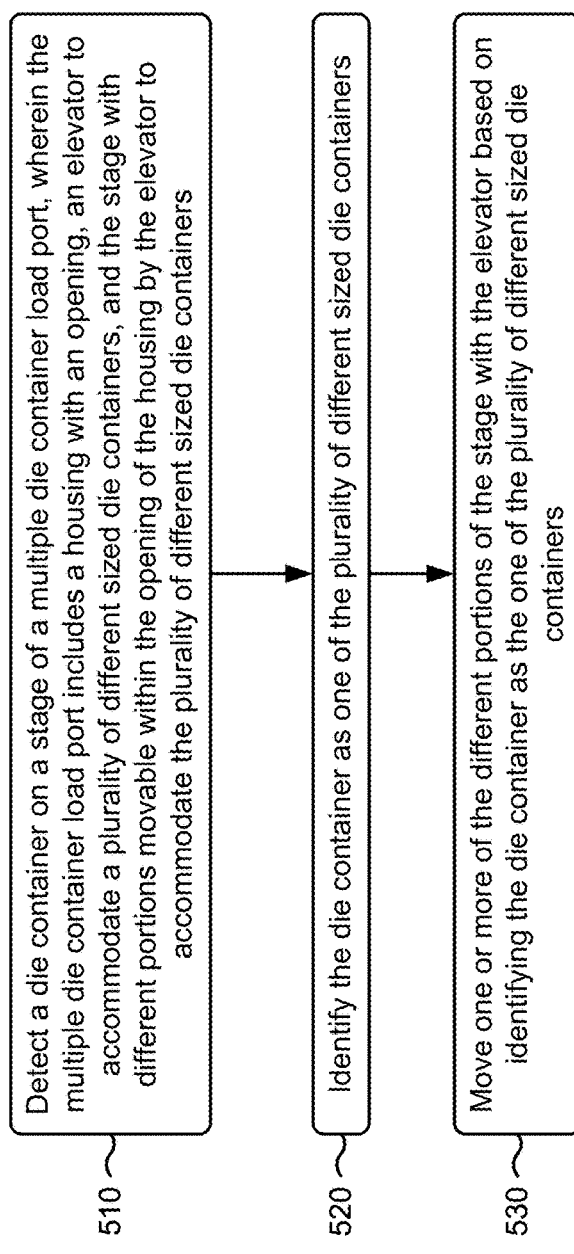
FIG. 5 is a flowchart of an example process for handling die containers with the multiple die container load port.

FIG. 5 is a flow chart of an example process 500 for handling die containers. In some implementations, one or more process blocks of FIG. 5 may be performed by a multiple die container load port (e.g., one or more components of multiple die container load port 105). In some implementations, one or more process blocks of FIG. 5 may be performed by another device or a group of devices separate from or including the multiple die container load port and/or by other components of the multiple die container load port. Additionally, or alternatively, one or more process blocks of FIG. 5 may be performed by one or more components of a device 400, such as processor 420, memory 430, storage component 440, input component 450, output component 460, communication interface 470, and/or the like.

As shown in FIG. 5, process 500 may include detecting a die container on a stage of a multiple die container load port, wherein the multiple die container load port includes a housing with an opening, an elevator to accommodate a plurality of different sized die containers, and the stage with different portions movable within the opening of the housing by the elevator to accommodate the plurality of different sized die containers (block 510). For example, tray position sensor 235, tray presence sensor 240, magazine position sensor 245, magazine presence sensor 250, tray cassette position sensor 255, or tray cassette presence sensor 260 of the multiple die container load port may detect a die container on stage 110 of the multiple die container load port, as described above. In some implementations, the multiple die container load port includes housing 115 with opening 305, elevator 120 to accommodate a plurality of different sized die containers, and stage 110 with different portions movable within opening 305 of housing 115 by elevator 120 to accommodate the plurality of different sized die containers.

As further shown in FIG. 5, process 500 may include identifying the die container as one of the plurality of different sized die containers (block 520). For example, tray position sensor 235, tray presence sensor 240, magazine position sensor 245, magazine presence sensor 250, tray cassette position sensor 255, or tray cassette presence sensor 260 of the multiple die container load port may identify the die container as one of the plurality of different sized die containers, as described above.

As further shown in FIG. 5, process 500 may include moving one or more of the different portions of the stage with the elevator based on identifying the die container as the one of the plurality of different sized die containers (block 530). For example, the multiple die container load port may move one or more of the different portions of stage 110 with elevator 120-1, elevator 120-2, or elevator 120-3 based on identifying the die container as the one of the plurality of different sized die containers, as described above.

Process 500 may include additional implementations, such as any single implementation or any combination of implementations described below and/or in connection with one or more other processes described elsewhere herein.

In a first implementation, when the one of the plurality of different sized die containers is a tray 125, elevator 120-2 is to move a portion of stage 110 and tray 125 to align with a conveyor, and cause tray 125 to be provided to the conveyor.

In a second implementation, alone or in combination with the first implementation, when the one of the plurality of different sized die containers is a magazine 130 with trays 125, elevators 120-1, 120-2, and 120-3 are to move stage 110 and magazine 130 to align with a conveyor, and cause one or more of trays 125 of magazine 130 to be provided to the conveyor.

In a third implementation, alone or in combination with one or more of the first and second implementations, when the one of the plurality of different sized die containers is a tray cassette 135 with trays 125, elevator 120-2 is to move one or more of trays 125 of tray cassette 135, with a portion of stage 110, to align with a conveyor, and cause the one or more of trays 125 of tray cassette 135 to be provided to the conveyor.

In a fourth implementation, alone or in combination with one or more of the first through third implementations, a first type of the plurality of different sized die containers is supported by a first area of stage 110, a second type of the plurality of different sized die containers is supported by a second area of stage 110, a third type of the plurality of different sized die containers is supported by a third area of stage 110, the third area is greater than the second area, and the second area is greater than the first area.

In a fifth implementation, alone or in combination with one or more of the first through fourth implementations, the multiple die container load port is associated with a die processing tool.

In a sixth implementation, alone or in combination with one or more of the first through fifth implementations, stage 110 further includes a first portion 325 to support a first type of the plurality of different sized die containers, and a second portion 330 to support a second type and a third type of the plurality of different sized die containers.

In a seventh implementation, alone or in combination with one or more of the first through sixth implementations, identifying the die container as the one of the plurality of different sized die containers includes identifying the die container as the one of the plurality of different sized die containers with tray position sensor 235, magazine position sensor 245, or tray cassette position sensor 255 of the multiple die container load port.

In an eighth implementation, alone or in combination with one or more of the first through seventh implementations, when the one of the plurality of different sized die containers is a tray 125, moving the one or more of the different portions of stage 110 includes moving, with elevator 120, a portion of stage 110 and tray 125 to align with a conveyor, and causing tray 125 to be provided to the conveyor.

In a ninth implementation, alone or in combination with one or more of the first through eighth implementations, when the one of the plurality of different sized die containers is a magazine 130 with trays 125 of dies, moving the one or more of the different portions of stage 110 includes moving, with elevator 120, the different portions of stage 110 and magazine 130 to align with a conveyor, and causing one or more of trays 125 of magazine 130 to be provided to the conveyor.

In a tenth implementation, alone or in combination with one or more of the first through ninth implementations, when the one of the plurality of different sized die containers is a tray cassette 135 with trays 125 of dies, moving the one or more of the different portions of stage 110 includes moving, with elevator 120, one or more of trays 125 of tray cassette 135, with a portion of stage 110, to align with a conveyor, and causing the one or more of trays 125 of tray cassette 135 to be provided to the conveyor.

In an eleventh implementation, alone or in combination with one or more of the first through tenth implementations, detecting the die container on stage 110 includes utilizing tray presence sensor 240, magazine presence sensor 250, or tray cassette presence sensor 260 to detect the die container on the stage.

In a twelfth implementation, alone or in combination with one or more of the first through eleventh implementations, process 500 includes receiving the die container on stage 110 at an orientation determined by one or more of tray position sensor 235, magazine position sensor 245, or tray cassette position sensor 255 provided on stage 110.

In a thirteenth implementation, alone or in combination with one or more of the first through twelfth implementations, the die container stores a plurality of dies to be processed.

In a fourteenth implementation, alone or in combination with one or more of the first through thirteenth implementations, tray 125 is supported by a first area of stage 110, magazine 130 is supported by a second area of stage 110, tray cassette 135 is supported by a third area of stage 110, the third area is greater than the second area, and the second area is greater than the first area.

In a fifteenth implementation, alone or in combination with one or more of the first through fourteenth implementations, the multiple die container load port includes tray presence sensor 240, magazine presence sensor 250, and tray cassette presence sensor 260 to detect a presence of the type of die container is supporting by stage 110.

In a sixteenth implementation, alone or in combination with one or more of the first through fifteenth implementations, stage 110 further includes a first portion 325 to support tray 125, and a second portion 330 to support the magazine and tray cassette 135.

In a seventeenth implementation, alone or in combination with one or more of the first through sixteenth implementations, stage 110 includes tray position sensor 235, magazine position sensor 245, and tray cassette position sensor 255 to facilitate positioning of the two or more different types of die containers on stage 110.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, multiple die container load port 105 may handle multiple different die containers without modifying load port 105 for the different die containers. For example, multiple die container load port 105 may handle trays 125 with dies, magazines 130 with trays, tray cassettes 135 with trays 125, and/or the like. Thus, multiple die container load port 105 may prevent damage to dies caused by human handling of die containers, may increase throughput of die production functions, may conserve resources (e.g., human resources, tool resources, and/or manufacturing resources), and/or the like.

As described in greater detail above, some implementations described herein provide a multiple die container load port. The multiple die container load port may include a housing with an opening, and an elevator to accommodate a plurality of different sized die containers. The multiple die container load port may include a stage supported by the housing and moveable within the opening of the housing by the elevator. The stage may include one or more positioning mechanisms to facilitate positioning of the plurality of different sized die containers on the stage, and may include different portions movable by the elevator to accommodate the plurality of different sized die containers. The multiple die container load port may include a position sensor to identify one of the plurality of different sized die containers positioned on the stage.

As described in greater detail above, some implementations described herein provide a method performed by a multiple die container load port. The method may include detecting a die container on a stage of a multiple die container load port, wherein the multiple die container load port may include a housing with an opening, an elevator to accommodate a plurality of different sized die containers, and the stage with different portions movable within the opening of the housing by the elevator to accommodate the plurality of different sized die containers. The method may include identifying the die container as one of the plurality of different sized die containers, and moving one or more of the different portions of the stage with the elevator based on identifying the die container as the one of the plurality of different sized die containers.

As described in greater detail above, some implementations described herein provide a multiple die container load port. The multiple die container load port may include a housing, an elevator, and a stage supported by the housing and moveable within the housing by the elevator. The stage may support two or more different types of die containers. The multiple die container load port may include a position sensor to identify a type of die container supported by the stage. When the type of die container is a tray, the elevator may move a portion of the stage and the tray to align with a conveyor. When the type of die container is a magazine with trays of dies, the elevator may move the stage and the magazine to align with the conveyor. When the type of die container is a tray cassette with trays of dies, the elevator may move one or more of the trays of the tray cassette, with the portion of the stage, to align with the conveyor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A load port, comprising:
   a housing;
   one or more elevators;
   a stage moveable within the housing by the one or more elevators,
      wherein the stage includes a mechanism to support multiple types of die containers,
      wherein the stage includes:
         a first portion movable by the one or more elevators to accommodate a first die container type of the multiple types of die containers, and
         a second portion movable by the one or more elevators to accommodate a second die container type of the multiple types of die containers,
            wherein the first die container type and the second die container type have different outer dimensions; and
   a position sensor configured to identify a type of a die container positioned on the stage.

2. The load port of claim 1, wherein the multiple types of die containers comprise at least two of:
   a tray,
   a magazine, or
   a tray cassette.

3. The load port of claim 1, wherein, when the type of the die container is a tray, the one or more elevators are configured to:
   move the first portion from a first position to a second position.

4. The load port of claim 3, wherein the first position is a loading position and the second position is an unloading position.

5. The load port of claim 3, wherein the second position is associated with providing the tray to a conveyor.

6. The load port of claim 3,
   wherein the one or more elevators are configured to:
      keep the second portion remaining at the first position while moving the first portion from the first position to the second position.

7. The load port of claim 1, wherein, when the type of the die container is a magazine, the one or more elevators are configured to:
move an entirety of the stage from a first position to a second position.

8. The load port of claim 7, wherein the second position is associated with providing one or more trays of the magazine to a conveyor.

9. The load port of claim 1, wherein, when the type of the die container is a tray cassette, the one or more elevators are configured to:
move the second portion from a first position to a second position.

10. The load port of claim 9, wherein the second position is associated with providing one or more trays of the tray cassette to a conveyor.

11. A method, comprising:
identifying a die container on a stage of a load port as a particular type of die container,
wherein the load port further includes:
a housing, and
one or more elevators; and
moving one or more portions of the stage using the one or more elevators based on identifying the die container as the particular type,
wherein a first portion, of the one or more portions, is moved using the one or more elevators when the die container is a first die container type, and
wherein a second portion, of the one or more portions, is moved using the one or more elevators when the die container is a second die container type that has different outer dimensions than the first die container type.

12. The method of claim 11, wherein moving the one or more portions of the stage comprises:
moving the first portion from a first position to a second position based on identifying the die container as a tray.

13. The method of claim 11, wherein moving the one or more portions of the stage comprises:
moving an entirety of the stage from a first position to a second position based on identifying the die container as a magazine.

14. The method of claim 11, wherein moving the one or more portions of the stage comprises:
moving the second portion from a first position to a second position based on identifying the die container as a tray cassette.

15. The method of claim 11, wherein moving the one or more portions of the stage comprises:
moving the one or more portions of the stage to a height aligned with a conveyor of a die processing tool.

16. A non-transitory computer-readable medium storing a set of instructions, the set of instructions comprising:
one or more instructions that, when executed by one or more processors of a device, cause the device to:
identify a die container on a stage of a load port as a particular type of die container,
wherein the load port further includes:
a housing, and
one or more elevators; and
move one or more portions of the stage using the one or more elevators based on identifying the die container as the particular type,
wherein a first portion, of the one or more portions, is moved using the one or more elevators when the die container is a first die container type, and
wherein a second portion, of the one or more portions, is moved using the one or more elevators when the die container is a second die container type that has different outer dimensions than the first die container type.

17. The non-transitory computer-readable medium of claim 16, wherein the one or more instructions, that cause the device to move the one or more portions of the stage, cause the device to:
move the first portion from a first position to a second position based on identifying the die container as a tray.

18. The non-transitory computer-readable medium of claim 16, wherein the one or more instructions, that cause the device to move the one or more portions of the stage, cause the device to:
move an entirety of the stage from a first position to a second position based on identifying the die container as a magazine.

19. The non-transitory computer-readable medium of claim 16, wherein the one or more instructions, that cause the device to move the one or more portions of the stage, cause the device to:
move the second portion from a first position to a second position based on identifying the die container as a tray cassette.

20. The non-transitory computer-readable medium of claim 16, wherein the one or more instructions, that cause the device to move the one or more portions of the stage, cause the device to:
move the one or more portions of the stage to a height aligned with a conveyor of a die processing tool.

* * * * *